(12) United States Patent
Eich

(10) Patent No.: US 8,626,616 B2
(45) Date of Patent: Jan. 7, 2014

(54) METHOD AND APPARATUS FOR MANAGING INSTALLATION INFORMATION

(75) Inventor: Chris Eich, Sebastopol, CA (US)

(73) Assignee: Enphase Energy, Inc., Petaluma, CA (US)

( * ) Notice: Subject to any disclaimer, the term of this patent is extended or adjusted under 35 U.S.C. 154(b) by 11 days.

(21) Appl. No.: 13/065,879

(22) Filed: Mar. 31, 2011

(65) Prior Publication Data

US 2011/0246338 A1    Oct. 6, 2011

Related U.S. Application Data

(60) Provisional application No. 61/341,538, filed on Apr. 1, 2010.

(51) Int. Cl.
*G06Q 10/00* (2012.01)

(52) U.S. Cl.
USPC ............ 705/28; 705/44; 705/14.58; 370/328; 701/2; 709/226; 235/492; 342/357.25

(58) Field of Classification Search
USPC ................ 705/28, 44, 14.58; 370/328, 29; 455/422.1; 709/226, 203
See application file for complete search history.

(56) References Cited

U.S. PATENT DOCUMENTS

| | | | |
|---|---|---|---|
| 6,546,535 B1 | 4/2003 | Nagao et al. | |
| 7,092,964 B1 * | 8/2006 | Dougherty et al. | 705/27.1 |
| 7,321,774 B1 * | 1/2008 | Lau et al. | 455/456.1 |
| 7,937,470 B2 * | 5/2011 | Curley et al. | 709/226 |
| 7,991,694 B2 * | 8/2011 | Takayama | 705/41 |
| 8,204,709 B2 * | 6/2012 | Presher et al. | 702/88 |
| 2004/0044434 A1 | 3/2004 | Morimura | |
| 2004/0254836 A1 * | 12/2004 | Emoke Barabas et al. | 705/14 |
| 2006/0178917 A1 * | 8/2006 | Merriam et al. | 705/7 |
| 2009/0234692 A1 | 9/2009 | Powell et al. | |
| 2011/0053614 A1 * | 3/2011 | Mishina et al. | 455/456.6 |
| 2012/0019365 A1 * | 1/2012 | Tuikka et al. | 340/10.1 |
| 2012/0072288 A1 * | 3/2012 | Dusig et al. | 705/14.58 |

FOREIGN PATENT DOCUMENTS

| | | | |
|---|---|---|---|
| JP | 2002/085814 | A | 3/2002 |
| JP | 2002/140213 | A | 5/2002 |
| JP | 3378822 | B2 | 12/2002 |

OTHER PUBLICATIONS

International Search Report and Written Opinion mailed Nov. 28, 2011 for PCT Application No. PCT/US2011/030722.
U.S. Appl. No. 12/931,081, filed Jan. 24, 2011, entitled "Method and Apparatus for Interconnecting Distributed Power Sources", 26 pages.

(Continued)

*Primary Examiner* — Vanel Frenel
(74) *Attorney, Agent, or Firm* — Moser Taboada

(57) ABSTRACT

A method and apparatus for managing installation information. In one embodiment the method comprises obtaining, via an installation application on a mobile device comprising at least one processor, identification information for at least one component of an installation; obtaining, via the installation application, position information for the at least one component; and generating, via the installation application, a template for indicating a physical layout of at least a portion of the installation based on the identification information and the position information.

20 Claims, 8 Drawing Sheets

(56) References Cited

OTHER PUBLICATIONS

"Unirac Launches Free Inclinometer and QR-Code Reader Apps for iPhone and Other Devices" downloaded on Sep. 2, 2011 from website: http://www.unirac.com/?q=press-releases/unirac-launches-free-inclinometer-and-qr-code-reader-apps-iphone-and-other-devices 4 pages.

"Site Mapper", downloaded on Sep. 2, 2011 from website: http://www.solaredge.com/groups/installer-tools/site-mapping-tool 3 pages.

"SolarEdge Site Mapper Software Guide for iPhone", downloaded on Sep. 2, 2011 from website: http://www.solaredge.com/files/pdfs/solaredge-site-mapper-manual.pdf 23 pages.

"SolarEdge Installation Training Highlights" downloaded on Sep. 2, 2011 from website: http://www.solaredge.com/groups/movies 5 pages.

"SMA Introduces Solarchecker iPhone Application" downloaded on Sep. 2, 2011 from website: http://www.solarindustrymag.com/e107_plugins/content/content.php?content.4894 4 pages.

* cited by examiner

METHOD AND APPARATUS FOR MANAGING INSTALLATION INFORMATION

CROSS-REFERENCE TO RELATED APPLICATIONS

This application claims benefit of U.S. provisional patent application Ser. No. 61/341,538, filed Apr. 1, 2010, which is herein incorporated by reference.

BACKGROUND OF THE INVENTION

1. Field of the Invention

Embodiments of the present disclosure relate generally to solar arrays and, in particular, to automatically obtaining information pertaining to a solar array.

2. Description of the Related Art

Solar arrays generally comprise a plurality of photovoltaic (PV) modules deployed in a grid-style configuration, where one or more of the PV modules are coupled to one or more power converters, such as an inverter for inverting DC power from the PV modules to AC power. Information pertaining to the placement of each component within the array is required for efficient operation of the array, for example for generating a graphical depiction of the array for monitoring purposes or for dispatching a technician to address a problem with a particular PV module or inverter.

During installation and commissioning of solar arrays, installers often manually document required information for identifying the locations of the array components (e.g., PV modules, DC/DC converters, DC/AC inverters, DC/AC wiring connections, or solar trackers). For example, an installer may manually enter an identification (ID) number for a component into a chart that depicts the layout of the array; place a sticker with an ID number on a component and place a corresponding sticker indicating the ID number onto a sheet of paper arranged in the same layout as the array; or perform similar techniques for collecting and documenting the array layout information. Such methods of obtaining data pertaining to the physical arrangement of components in an array are tedious and prone to human error.

Therefore, there is a need in the art for a method and apparatus for efficiently managing data pertaining to an installation layout.

SUMMARY OF THE INVENTION

Embodiments of the present invention generally relate to a method and apparatus for managing installation information. In one embodiment the method comprises obtaining, via an installation application on a mobile device comprising at least one processor, identification information for at least one component of an installation; obtaining, via the installation application, position information for the at least one component; and generating, via the installation application, a template for indicating a physical layout of at least a portion of the installation based on the identification information and the position information.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
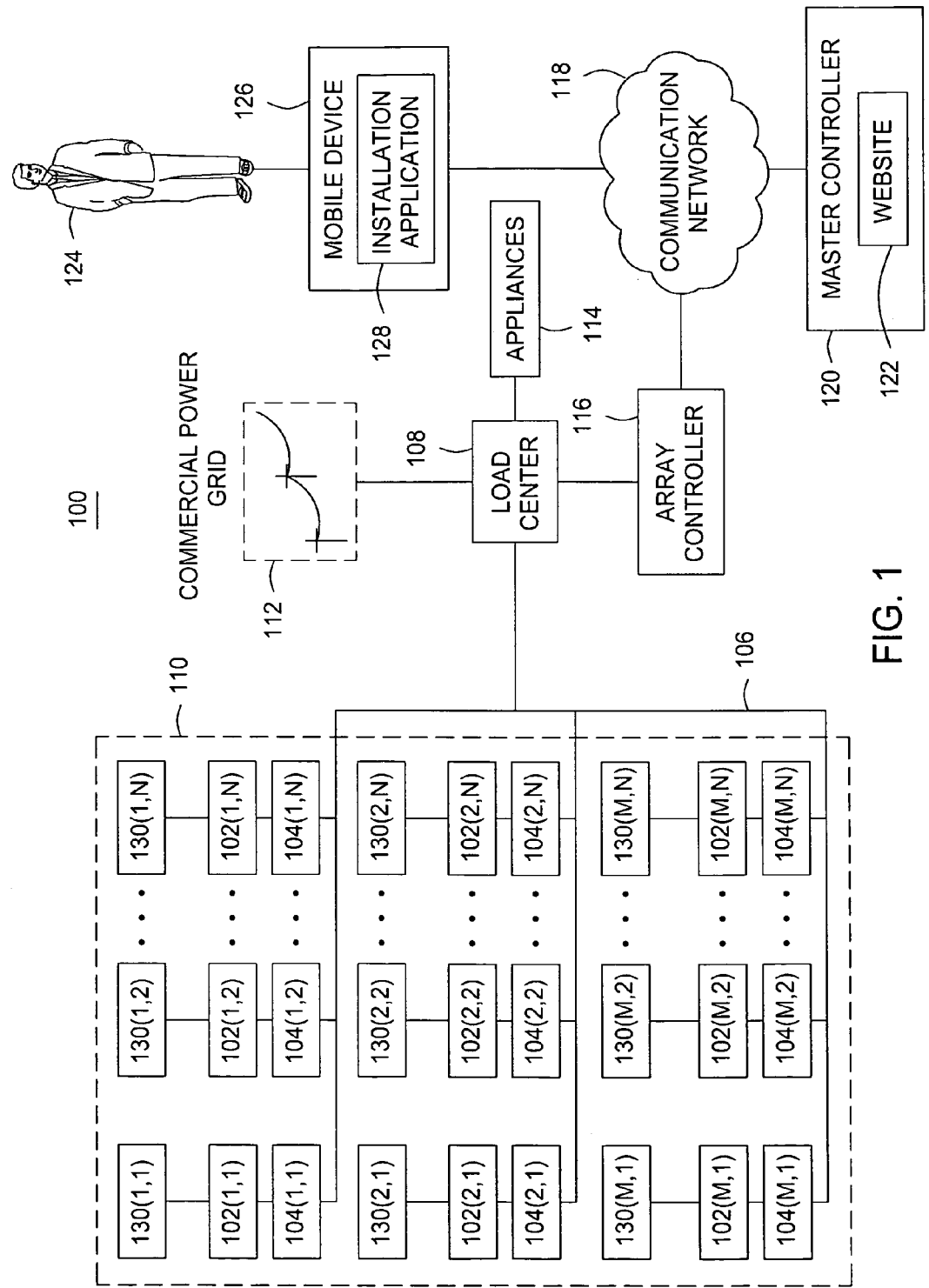
FIG. 1 is a block diagram of a power generation system comprising a solar array in accordance with one or more embodiments of the present invention.

FIG. 1 is a block diagram of a power generation system 100 ("system 100") comprising a solar array 110 in accordance with one or more embodiments of the present invention. This diagram only portrays one variation of the myriad of possible system configurations. The present invention can function in a variety of environments and systems.

The system 100 comprises the solar array 110 coupled to a load center 108 via an AC bus 106. The solar array 110 comprises a plurality of PV modules 102(1,1), 102(1,2) . . . 102(M,N), collectively referred to as PV modules 102, and a plurality of inverters 104(1,1), 104(1,2) . . . 104(M,N), collectively referred to as inverters 104. Each inverter 104(1,1), 104(1,2) . . . 104(M,N) is coupled in a one-to-one correspondence to a PV module 102(1,1), 102(1,2) . . . 102(M,N), respectively, and is further coupled to the AC bus 106. The PV modules 102/coupled inverters 104 are generally arranged within the solar array 110 in a grid pattern having M-rows and N-columns, although other arrangements may be utilized.

In some embodiments, a DC/DC converter may be coupled between each PV module 102 and each inverter 104 (e.g., one converter per PV module 102). Alternatively, one or more inverters 104 may each be coupled to multiple PV modules 102; for example, the PV modules 102 may all be coupled to a single, centralized inverter 104. In some such embodiments, a DC/DC converter may be coupled between each PV module 102 and the corresponding inverter(s) 104. In one or more alternative embodiments, the inverters 104 may be replaced by DC/DC converters and the generated DC power is coupled to a centralized DC/AC inverter (e.g., an inverter located at the load center 108), DC-driven systems, and/or a DC storage system, such as batteries, for later use.

In some embodiments, the solar array 110 comprises a plurality of solar trackers 130(1,1), 130(1,2) . . . 130(M,N), collectively referred to as solar trackers 130. One or more of the solar trackers 130(1,1), 130(1,2) . . . 130(M,N) may each be coupled in a one-to-many correspondence to the PV modules 102(1,1), 102(1,2) . . . 102(M,N), although a one-to-one coupling is depicted in FIG. 1. The solar trackers 130 may be Tilted Single Axis Trackers, Dual Axis Trackers, or the like.

The inverters 104 convert DC power from the PV modules 102 to AC power that is commercial power grid compliant and then couple the AC power to the load center 108. The generated AC power may be further coupled from the load center 108 to one or more appliances 114 (e.g., at a private residence or business) and/or to a commercial power grid 112. Additionally or alternatively, energy generated by the inverters 104 may be stored for later use; for example, the generated energy may be stored utilizing batteries, heated water, hydro pumping, $H_2O$-to-hydrogen conversion, or the like.

The system 100 further comprises an array controller 116 coupled to the load center 108 for providing operational control of the inverters 104. In some embodiments, the array controller 116 provides such control utilizing power line communication (PLC) to communicate with the inverters 104; additionally or alternatively, the array controller 116 may utilize other types of wired and/or wireless techniques for communicating with the inverters 104. The array controller 116 is further communicatively coupled to a master controller 120 via a communications network 118 (e.g., the Internet) for sending information to/receiving information from the master controller 120. The array controller 116 may utilize wired and/or wireless techniques for coupling to the communications network 118; in some embodiments, the array controller 116 may be coupled to the communications network 118 via a commercially available router.

The master controller 120 may utilize wired and/or wireless techniques for coupling to the communications network 118 and may support a website 122 for managing the solar array 110. For example, a user may access the website 122 via a password protected portal to view a depiction of the solar array 110, to monitor messages regarding the solar array 110, to transmit instructions to the solar array 110, or to perform similar operation and maintenance functions for the solar array 110.

In accordance with one or more embodiments of the present invention, an installer 124 may utilize an installation application 128 resident on a mobile device 126 for managing (e.g., obtaining, generating, storing, viewing, uploading, or the like) information pertaining to the solar array 110 and/or the array controller 116 ("solar system information"). The mobile device 126 may be any commercially available device capable of supporting and running application software, such as a smart cell phone, a personal digital assistant (PDA), a tablet computer, netbook, laptop computer, or the like.

The solar system information may include position and/or identification information. The position information may identify relative and/or absolute positions (i.e., absolute positions based on a fixed coordinate system, such as global positioning system (GPS) coordinates, latitude and longitude coordinates, or the like) of one or more solar array components (e.g., relative positions of the PV modules 102 within the solar array 110; absolute positions of the inverters 104 based on global positioning system (GPS) coordinates; absolute position of the controller 116 based on GPS coordinates; and the like). The identification information may be used to identify one or more solar array components (e.g., serial numbers, part numbers, assigned identification (ID) numbers, and the like). In some polyphase embodiments, the solar system information may include phase information that indicates those phases to which the inverters 104 are coupled. The solar system information may additionally or alternatively include similar information pertaining to the components of the solar array 110.

The solar system information may further include site information pertaining to the solar array 110, such as an address or GPS coordinates; a map; a rendered drawing, photograph, or other imagery; a project number corresponding to the solar array 110; or the like. In some embodiments, the mobile device 126 may comprise an application for obtaining a map, photograph, or other imagery of the solar array site from an existing website.

The installation application 128 may also generate associations between various subsets of the solar system information that can be related to one another. Such associations may be generated automatically and/or based on manual entries by the installer 124 and indicate a relationship between the information. For example, an address of the solar array site may be associated with identification information for each PV module 102 and inverter 104; the identification information for each of a coupled PV module 102 and inverter 104 may be associated; the identification information for each of a coupled PV module 102 and a solar tracker 130 may be associated; GPS coordinates and serial numbers for each of the inverters 104 may be associated with an aerial photograph of the solar array site to produce an overlay of the coordinates and serial numbers on the aerial photograph; or other similar associations among the solar system information may be generated.

The solar system information may be uploaded from the mobile device 126 to the array controller 116 and/or the master controller 120. Additionally or alternatively, the solar system information may be saved on one or more of the mobile device 126, the array controller 116, or the master controller 120, and may be accessible via the website 122. In some embodiments, one or more of the mobile device 126, the array controller 116, or the master controller 120 may be coupled to a printer for printing some or all of the solar system information.

The installer 124 may add the installation application 128 to the mobile device 126 and, upon initial activation of the installation application 128, enter user profile information, such as a user identification (ID), a login and password for the website 122, a login and password for the array controller 116 and/or master controller 120, or the like. Upon subsequent activations of the installation application 128, the installation application 128 may perform automatic login and authentication to the website 122, the array controller 116, and/or the master controller 120 on behalf of the installer 124; in some embodiments, the installer 124 may be required to enter a password for the installation application 128 to perform such login/authentication.

In some embodiments, the installer 124 may utilize the installation application 128 to obtain identification information for solar array components (e.g., the PV modules 102, the inverters 104, and the array controller 116) by "scanning" each component with the mobile device 126. Such scanning may be performed as part of installing a component of the solar array 110 or subsequent to installation. In some embodiments, such scanning comprises utilizing the mobile device 126 to optically read an identification tag, such as a label (e.g., a barcode label, a label having optical characters, or the like) on a solar array component. In other embodiments, an identification tag (e.g., a radio frequency identification, or RFID, tag, or a similar device) coupled to a component may wirelessly communicate the identification information to the installation application 128 when the mobile device 126 is proximate the component. Such identification tags may be placed on or coupled to the solar array components, for example, during manufacturing or installation. In some embodiments, the inverters 104 themselves may wirelessly communicate identification information to the installation application 128 when the mobile device 126 is proximate the inverters 104. Identification information may also be obtained by scanning the array controller 116.

The identification information obtained from an inverter 104 may, in addition to comprising one or more identifiers for the inverter 104, comprise one or more identifiers for a PV module 102 that is coupled to the inverter 104. In some embodiments where an inverter 104 is coupled to two or more PV modules 102, the identification information may comprise identifiers for the inverter 104 as well as each of the coupled PV modules 102; alternatively, the installation application 128 may determine from the identification information (e.g., from one or more inverter identifiers) that the inverter 104 is coupled to multiple PV modules. Additionally or alternatively, the identification information obtained from a PV module 102 may, in addition to comprising one or more identifiers for the PV module 102, comprise one or more identifiers for an inverter 104 that is coupled to the PV module 102.

In some polyphase embodiments, phase information may be obtained by the installation application 128, for example, via the identification tags, for identifying those phases to which the inverters 104 are coupled.

The installer 124 may also utilize the installation application 128 within the mobile device 126 for recording position information to identify relative and/or absolute positions (i.e., absolute positions based on a fixed coordinate system, such as latitude and longitude coordinates, GPS coordinates, or the like) of the solar array components. In some embodiments, the installer 124 may manually enter the position information for a particular component into the mobile device 126; in other embodiments, the installer 124 may place the mobile device 126 proximate a component and the installation application 128 automatically obtains corresponding position information (e.g., absolute position of the component obtained, for example, via GPS or wireless signal triangulation techniques). The installation application 128 may automatically associate the obtained position information with the identification information for the corresponding solar array component (e.g., the position and identification information for an inverter 104 may be associated, the position and identification information for a PV module 102 may be associated, and the like). Position information for the array controller 116 may also be obtained and may be associated with identification information for the array controller 116 as well as the solar array 110.

In some embodiments, the installation application 128 may populate a template with a portion of the solar system information for generating a record of the physical configuration of the solar array 110. Such an installation layout template (i.e., an array layout template) may be configured in a pattern that corresponds to the layout of the solar array 110, such as a grid having M-rows and N-columns, where each cell within the template represents a location of a component (or a group of components, such as a coupled PV module 102/inverter 104) within the solar array 110. The installer 124 may select an appropriate template from a plurality of pre-defined templates, retrieve a template previously created for the solar array 110, or generate a new template. The installation application 128 may then populate each cell with at least one of identification or position information for a PV module 102 and/or inverter 104 installed at the corresponding location within the solar array 110. Additionally, a cell within the array layout template may correspond to the array controller 116 and be populated with identification and/or position information pertaining to the array controller 116. In some embodiments, phase information may also be used in populating the array layout template.

In order to populate a solar array layout template, the installer 124 may select a particular cell within the template by touching the cell on the display screen of the mobile device 126 and then scan the PV module 102 and/or inverter 104 installed at the complementary location within the solar array 110. Alternatively, a PV module 102 and/or inverter 104 may be scanned prior to being installed in the solar array 110 and a corresponding template cell selected at the time of installation. In some alternative embodiments, the installer 124 may manually enter information into a particular template cell.

In some embodiments, the installation application 128 may automatically identify a particular template cell to be populated by utilizing detected motion of the mobile device 126. For example, the installation application 128 may identify a template cell to be populated based on previous cells populated and data from a motion detection device of the mobile device 126 (such as one or more of an accelerometer, gyroscope, compass, or the like) that identifies a direction of motion of the mobile device 126. In other embodiments, the PV modules 102 and/or inverters 104 are scanned and the installation application 128 assumes a direction of motion (e.g., moving left-to-right across a row) and automatically populates the array layout template based on that assumption. If the assumed direction is not correct (e.g., at the end of one row), the application allows the installer 124 to correct its "guess" by selecting another template cell. Alternatively, the installer 124 may define a direction of motion for scanning the PV modules 102 and/or inverters 104 and the installation application 128 populates the array layout template accordingly.

In other embodiments, the installed PV modules 102 and/or inverters 104 are scanned and the installation application 128 automatically generates and populates the entire array layout template. For example, the installation application 128 may automatically determine a layout template and populate the template based on one or more of identification and position information obtained by scanning the PV modules 102, identification and position information obtained by scanning the inverters 104, motion of the mobile device 126, or assumed/specified direction of motion of the mobile device 126.

In still other embodiments, where the PV modules 102 and the inverters 104 are not yet installed, the installation application 128 may generate and/or display a template where each template cell depicts an identifier indicating which PV module 102 and/or inverter 104 should be installed at the complementary location within the solar array 110.

The installation application 128 may additionally associate an array layout template with site information for the solar array 110. For example, the installer 124 may scan the PV modules 102 and/or inverters 104 to generate an array layout template populated with identification and/or position information. The installation application 128 may then automatically obtain site information, such as a satellite image of the site based on GPS coordinates of the mobile device 126 during scanning of the solar array 110, and overlay the populated template on the satellite site image. Alternatively, the installation application 128 may obtain the site information prior to or during scanning of the solar array 110 and may associate the identification and/or position information with the site information in real time. In some embodiments, the installation application 128 may obtain the site information from a third-party website or may retrieve previously stored site information.

In one or more alternative embodiments, the installation application 128 may be utilized for obtaining identification information, position information, and/or site information for equipment installations other than for solar arrays.

Figure 2:
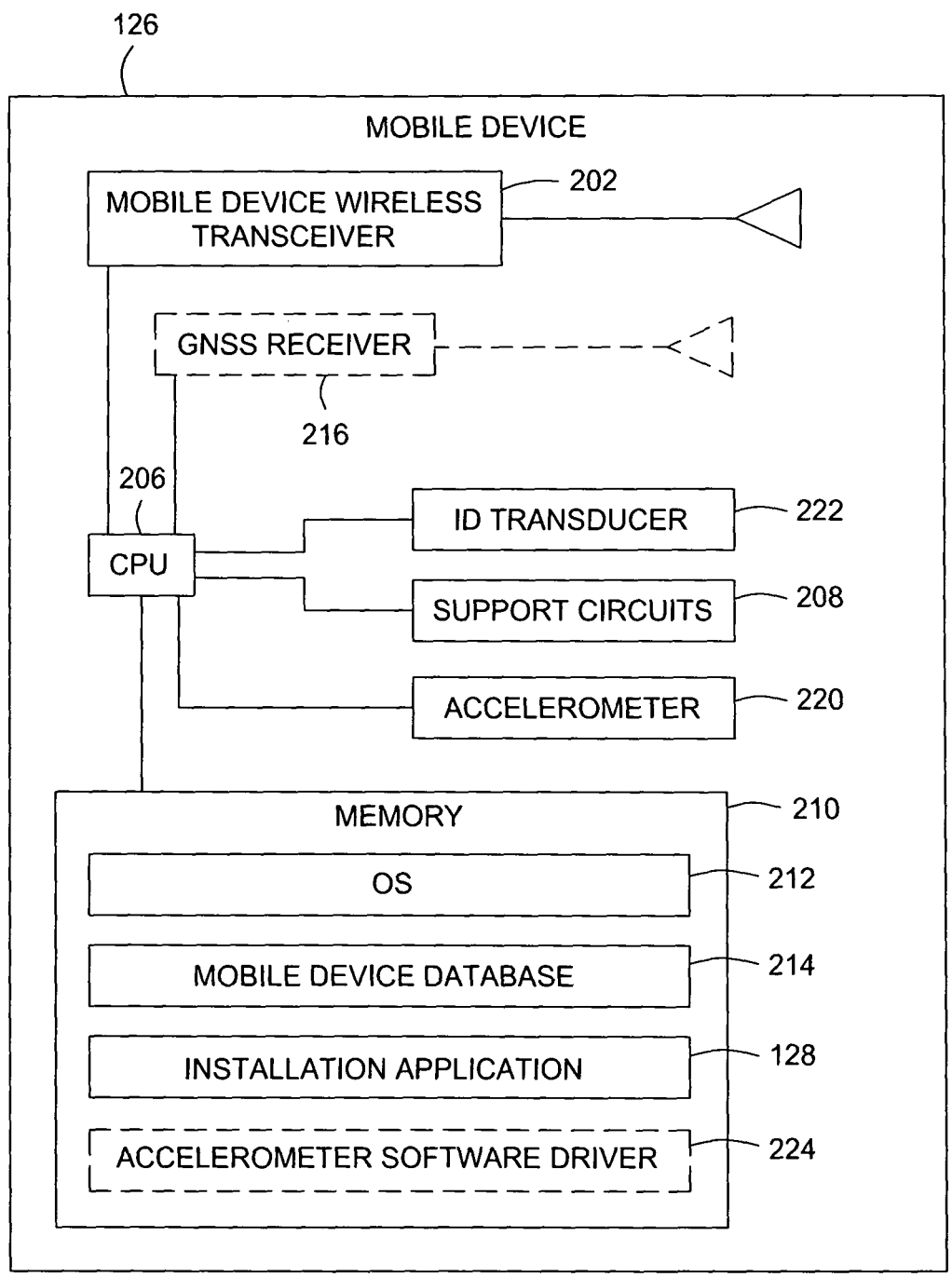
FIG. 2 is a block diagram of a mobile device in accordance with one or more embodiments of the present invention.

FIG. 2 is a block diagram of a mobile device 126 in accordance with one or more embodiments of the present invention. The mobile device 126 comprises a mobile device wireless transceiver 202, an ID transducer 222, support circuits 208, and a memory 210, each coupled to a central processing unit (CPU) 206. The mobile device wireless transceiver 202 wirelessly couples the mobile device 126 to the communications network 118 for communicating with the master controller 120 and/or the array controller 116. The mobile device 126 may additionally comprise a transceiver for providing communication utilizing wired techniques, for example, if the mobile device 126 is coupled to a computer connected to the communications network 118.

The ID transducer 222 facilitates the collection of the identification information. In some embodiments, the ID transducer 222 comprises components (e.g., an antenna and a transceiver) to communicatively couple the mobile device 126 to a wireless identification tag (e.g., an RFID tag or similar device) coupled to a PV module 102, an inverter 104, and/or the array controller 116 for obtaining identification information, for example by actively querying the ID tag for the identification information. Additionally or alternatively, the ID transducer 222 may comprise components (e.g., a camera or optical reader) for scanning identification tags, such as labels (e.g., a barcode label, a label having optical characters, or the like) to obtain the identification information. In some alternative embodiments, the ID transducer 222 may be separate from the mobile device 126 (i.e., external to the mobile device 126) and communicatively coupled to the mobile device 126. For example, the ID transducer 222 may be a BLUETOOTH enabled scanner wirelessly coupled to the mobile device 126. In some such embodiments, the ID transducer 126 may be physically coupled (e.g., detachably clipped, mounted, or the like) to the mobile device 126 for convenience.

The CPU 206 may comprise one or more conventionally available microprocessors or microcontrollers. Alternatively, the CPU 206 may include one or more application specific integrated circuits (ASICs). The support circuits 208 are well known circuits used to promote functionality of the CPU 206. Such circuits include, but are not limited to, a cache, power supplies, clock circuits, buses, network cards, input/output (I/O) circuits, and the like. The mobile device 126 may be implemented using a general purpose computer that, when executing particular software, becomes a specific purpose computer for performing various embodiments of the present invention.

The memory 210 may comprise random access memory, read only memory, removable disk memory, flash memory, and various combinations of these types of memory. The memory 210 is sometimes referred to as main memory and may, in part, be used as cache memory or buffer memory. The memory 210 generally stores an operating system (OS) 212 of the mobile device 126. The operating system 212 may be one of a number of commercially available operating systems such as, but not limited to, Windows Mobile by Microsoft Corp., iOS by Apple Inc., BLACKBERRY OS by Research In Motion, Access Linux Platform by Access Co., Palm OS by Palm, Inc., ANDROID by Open Handset Alliance, and the like.

The memory 210 stores various forms of application software, such as the installation application 128 for obtaining and managing solar system information pertaining to the solar array 110; in alternative embodiments, the installation application 128 may be implemented in hardware or a combination of hardware and software. In some embodiments, the installation application 128 may comprise label recognition software (e.g., barcode recognition software, optical character recognition software, RFID software, or the like), for example, for reading an image and/or data supplied by the ID transducer 222. The memory 210 may also comprise a mobile device database 214 for storing information related to the present invention, such as user profiles, identification/position/site information, array layout templates, information for previous installations, or the like.

In some embodiments, the mobile device 126 may additionally comprise one or more of a Global Navigation Satellite Systems (GNSS) receiver 216 (e.g., GPS, GLONASS, Galileo, and the like) to receive GNSS signals from a GNSS satellite for determining position information, such as GPS coordinates. Additionally or alternatively, position information may be obtained by wireless signal (e.g., cellular signal) triangulation techniques utilizing the mobile device wireless transceiver 202. In some embodiments, the mobile device 126 may further comprise an accelerometer 220, coupled to an accelerometer software driver 224 in the memory 210, for determining data pertaining to motion of the mobile device 126. Such data may be utilized in automatically populating an array layout template, as previously described.

Figure 3:
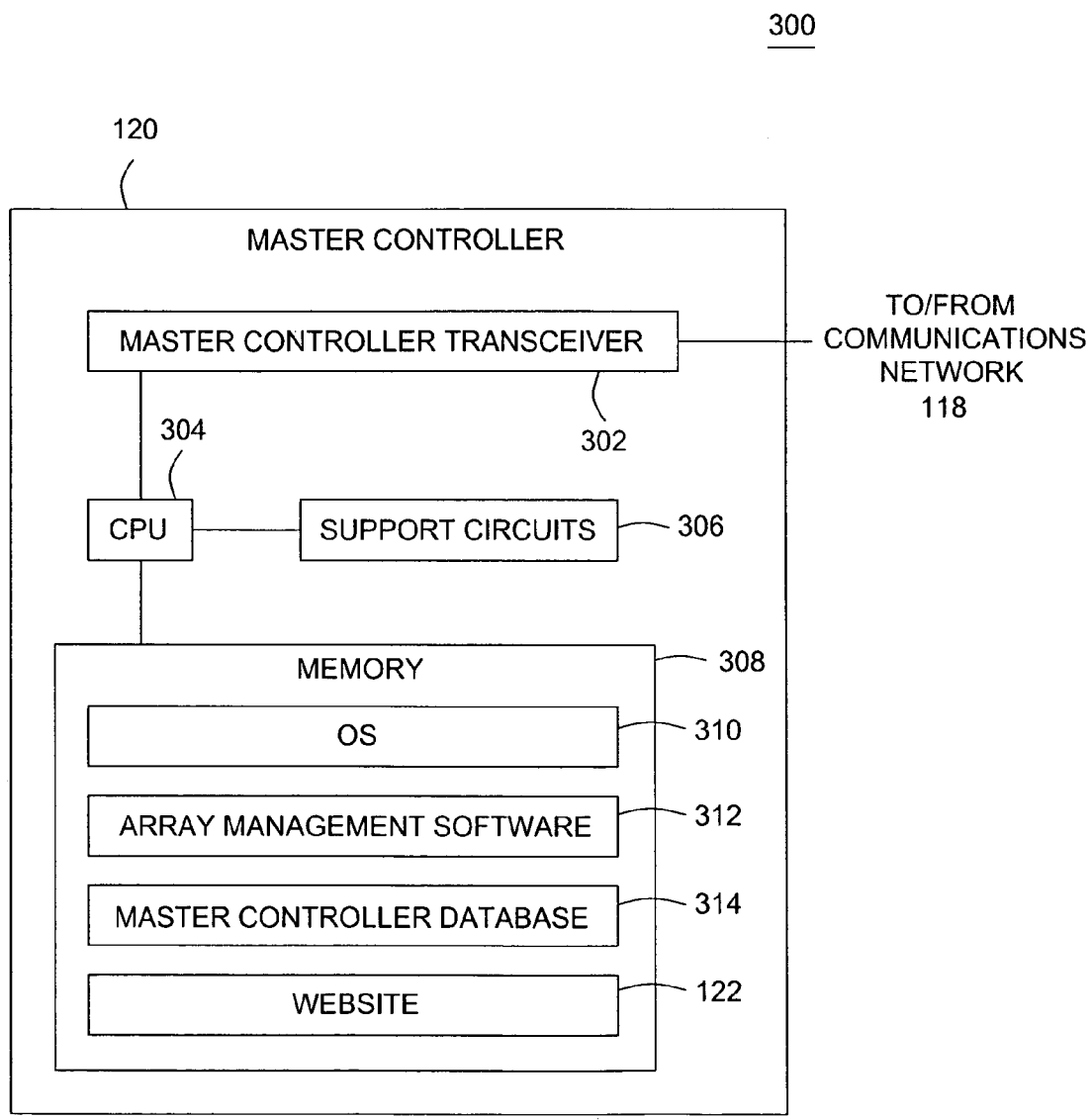
FIG. 3 is a block diagram of a master controller in accordance with one or more embodiments of the present invention.

FIG. 3 is a block diagram of a master controller 120 in accordance with one or more embodiments of the present invention. The master controller 120 comprises a master controller transceiver 302, support circuits 306, and a memory 308, each coupled to a central processing unit (CPU) 304.

The CPU 304 may comprise one or more conventionally available microprocessors or microcontrollers. Alternatively, the CPU 304 may include one or more application specific integrated circuits (ASICs). The support circuits 306 are well known circuits used to promote functionality of the CPU 304. Such circuits include, but are not limited to, a cache, power supplies, clock circuits, buses, network cards, input/output (I/O) circuits, and the like. The master controller 120 may be implemented using a general purpose computer that, when executing particular software, becomes a specific purpose computer for performing various embodiments of the present invention.

The master controller transceiver 302 communicatively couples the master controller 120 to the array controller 116 via the communications network 118 to facilitate the management of the solar array 110, for example for operating the array controller 116 and/or the inverters 104. Additionally, the master controller transceiver 302 communicatively couples the master controller 120 to the mobile device 126 via the communications network 118. The master controller transceiver 302 may utilize wireless or wired techniques, for example a WI-FI or WI-MAX modem, 3G modem, cable modem, Digital Subscriber Line (DSL), fiber optic, or similar type of technology, for coupling to the communications network 118.

The memory 308 may comprise random access memory, read only memory, removable disk memory, flash memory, and various combinations of these types of memory. The memory 308 is sometimes referred to as main memory and may, in part, be used as cache memory or buffer memory. The memory 308 generally stores an operating system (OS) 310 of the master controller 120. The operating system 310 may be one of a number of commercially available operating systems such as, but not limited to, SOLARIS from SUN Microsystems, Inc., AIX from IBM Inc., HP-UX from Hewlett Packard Corporation, LINUX from Red Hat Software, Windows 2000 from Microsoft Corporation, and the like.

The memory 308 may store various forms of application software, such as array management software 312 for managing the solar array 110, for example by providing instructions to the array controller 116 for operating the inverters 104. Additionally, the memory 308 may comprise various databases, such as a master controller database 314 for storing data pertaining to the present invention, such as user profiles, identification/position/site information, array layout templates, information for previous installations, or the like. The memory 308 may also comprise the website 122 for accessing and/or managing solar system information via a password protected portal.

Figure 4A:
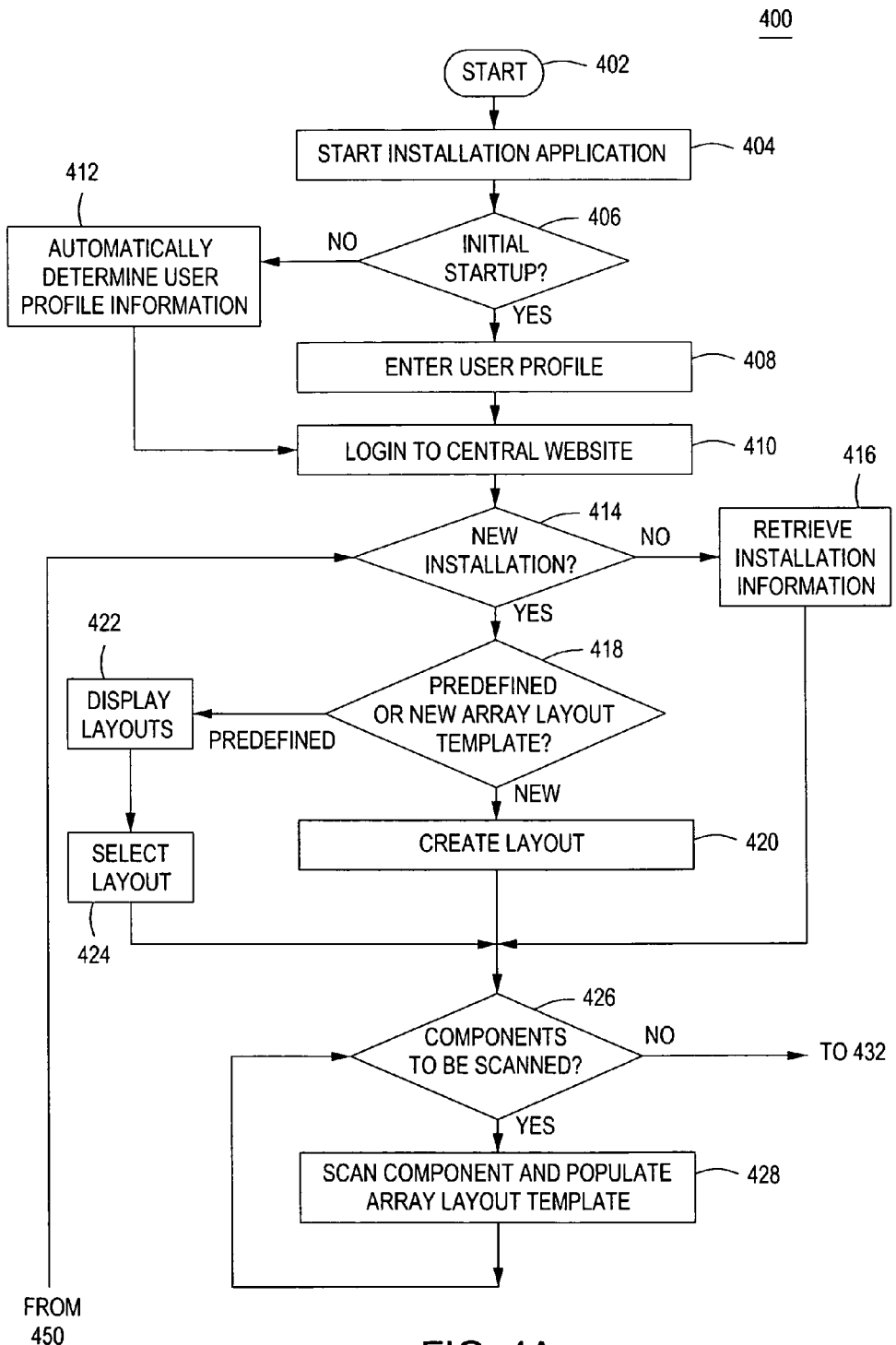
FIG. 4 is a flow diagram of a method for automatically obtaining solar system information in accordance with one or more embodiments of the present invention.
Figure 4B:
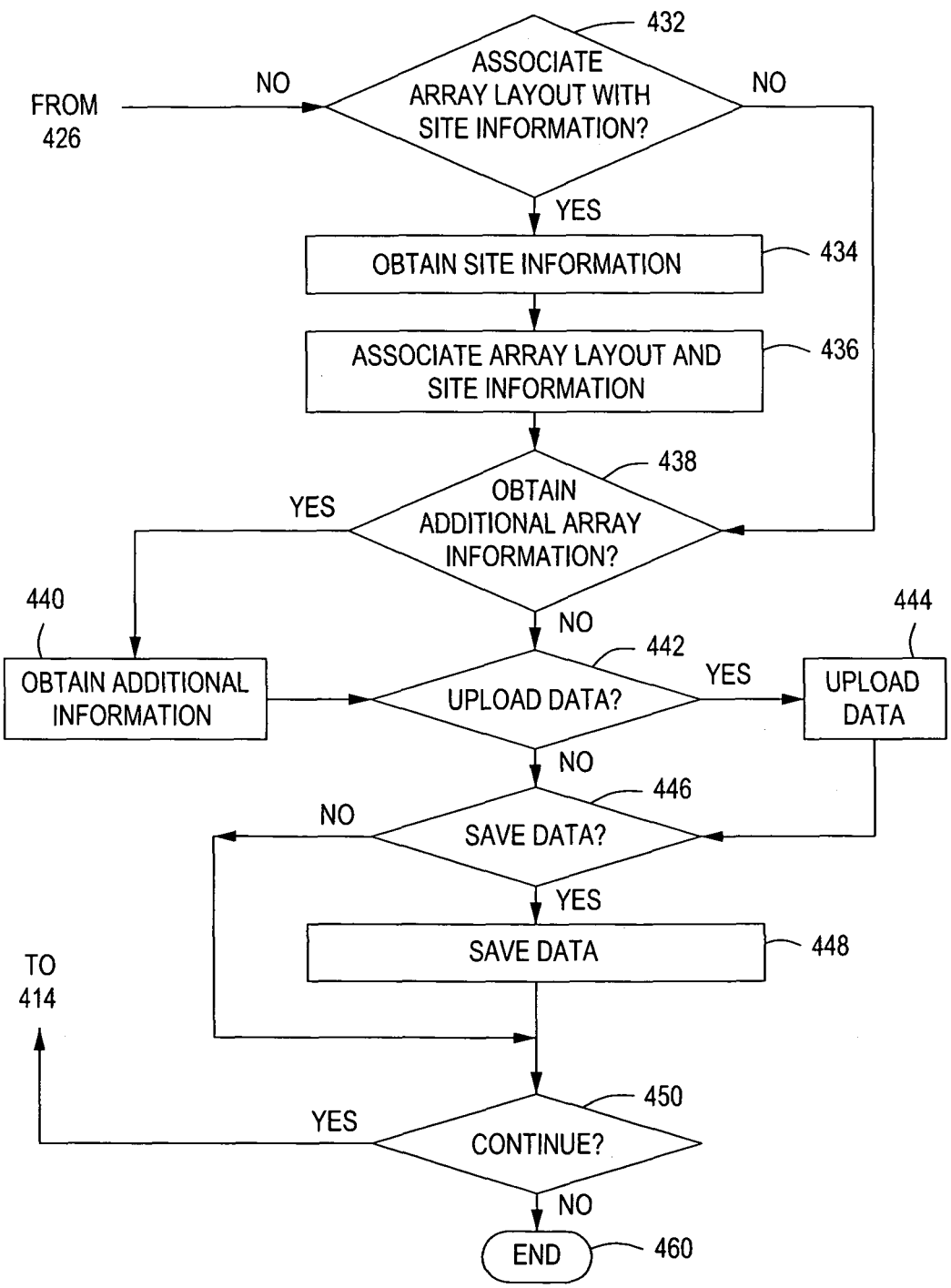

FIG. 4 is a flow diagram of a method 400 for automatically obtaining solar system information in accordance with one or more embodiments of the present invention. In some embodiments, such as the embodiment described below, an installer utilizes a mobile device on which an installation application resides for obtaining the solar system information pertaining to a solar array installation (e.g., the power generation system 100). In other embodiments, the installation application may be utilized for obtaining similar information for other types of equipment installations.

The method 400 starts at step 402 and proceeds to step 404. At step 404, the installation application is started. At step 406, a determination is made whether the installation application is being started for the first time (i.e., an initial startup). If the result of such determination is yes, the method 400 proceeds to step 408 where the installer enters user profile information, for example when prompted by the installation application. Such user profile information may include a user ID, a login to a central website for solar array management (e.g., the website 122), a password for the central website, a password for unlocking the installation application, or the like. The installation application may additionally store the user profile information, for example within a database of the mobile device. The method 400 then proceeds to step 410.

If, at step 406, it is determined that the installation application has been previously started, the method 400 proceeds to step 412. At step 412, the installation application automatically determines the user profile information; for example, the installation application may retrieve previously stored user profile information upon the installer entering a password. The method 400 proceeds to step 410.

At step 410, the installation application automatically logs into a central website for solar array management (e.g., the website 122) based on the user profile information. In some alternative embodiments, the installation application may perform such login at any time during execution of the method 400.

The method proceeds to step 414, where a determination is made whether the solar array installation is a new installation. In some embodiments, the installation application may make such a determination based on an input entered by the installer (e.g., a project number), site information pertaining to the location of the solar array (e.g., an address entered by the installer or GPS coordinates obtained automatically by the mobile device), or the like. If at step 414 it is determined that the installation is a new installation, the method 400 proceeds to step 418.

At step 418, a determination is made whether to document solar system information utilizing a predefined array layout template or whether to create a new array layout template. In some alternative embodiments, an array layout template is not utilized at all and the obtained solar system information may just be stored, for example, in a list format. In other alternative embodiments, the installation application may automatically build the array layout template based on position information obtained during scanning of the solar array components; in some such embodiments, the installer may select whether the template should be portrait or landscape, whether the template pattern should be aligned or brick, or similar criteria.

As previously described, the array layout template depicts the physical layout of solar array components; for example, the template may have a grid format where each cell within the grid represents a position of a PV module/inverter within the solar array. If, at step 418, it is determined that a new array layout template is to be created, the method 400 proceeds to step 420 to create the array layout template, for example by specifying planned and/or existing characteristics of the physical layout of the solar array, such as number of rows and columns, portrait or landscape, whether the solar array pattern is aligned or brick, PV module make and/or model, PV module physical size and/or aspect ratio, or the like. The array layout template may be viewed on a display screen of the mobile device (e.g., in portrait or landscape mode). The method 400 proceeds from step 420 to step 426.

If, at step 418, it is determined that a predefined array layout template should be utilized, the method 400 proceeds to step 422. At step 422, predefined array layout templates, or indicia for such templates, may be displayed on the mobile device and, at step 424, a particular layout is selected. Different template layouts may comprise different numbers of rows and/or columns; different alignments, such as portrait or landscape; different patterns, such as aligned or brick; different PV module characteristics, such as make, model, physical size, aspect ratio, and the like; or other information and/or characteristics pertaining to a solar array layout. Alternative to steps 422 and 424, a predefined array layout template specific to the solar array installation may be retrieved (e.g., from a database of the mobile device or downloaded from the central website). Such a predefined array layout template may have been previously created, for example during a site evaluation of the solar array site, and may be retrieved, for example, based on data the installer manually enters into the mobile device (e.g., a project number, an address), GPS coordinates automatically determined by the mobile device (i.e., when the installer is at the site), or similar information. The method 400 proceeds from step 424 to step 426.

If, at step 414, it is determined that the solar array installation is not a new installation, the method 400 proceeds to step 416. At step 416, existing information pertaining to the solar array installation is obtained, for example, from a database of the mobile device or downloaded from the central website. Such existing solar array installation information may include a partially populated solar array layout template, site information, or the like. The installation application may retrieve the existing solar array installation information based on an input entered by the installer (e.g., a project number, an address, or the like), GPS coordinates automatically determined by the mobile device (i.e., when the installer is at the site), or similar information. The method 400 proceeds to step 426.

At step 426, a determination is made whether components for the solar array installation (e.g., PV modules, inverters, an array controller, or the like) are to be scanned to obtain corresponding identification information. If the result of such determination is yes, the method 400 proceeds to step 428 where the components are scanned to obtain the identification information. Such identification information may include serial numbers, part numbers, assigned identification (ID) numbers, or similar information, and is utilized to populate the array layout template for identifying specific components within the array. In some polyphase embodiments where one or more inverters are each coupled to one or more phases of AC power, phase information may additionally be obtained for identifying those phases to which each inverter is coupled.

In some embodiments, a PV module, inverter, or array controller may be scanned by using the mobile device to optically read an identification tag, such as a label on the component; for example, a barcode label may be read by a barcode reader of the mobile device, or a label having identification characters may be read by an ID reader of the mobile device. Alternatively, an identification tag (e.g., a radio frequency identification, or RFID, tag) may be coupled to a component to wirelessly communicate the identification information to the installation application when the mobile device is proximate the component. Identification tags for conveying the identification information may be previously placed on/coupled to the solar array components (e.g., during manufacturing) or placed on/coupled to the solar array components as part of the installation process.

In some embodiments, identification information obtained from an inverter may additionally comprise one or more identifiers for a PV module or modules coupled to the inverter. In some such embodiments, if an inverter is coupled to two or more PV modules, the identification information obtained may comprise identifiers for each of the coupled PV modules; alternatively, the identification information may comprise a single PV module identifier and the installation application determines that the inverter is coupled to multiple PV modules based on the PV module identifier. In other embodiments, identification information obtained from a PV module may additionally comprise one or more identifiers for an inverter coupled to the PV module.

The identification information obtained by scanning the solar array components is utilized to populate the array layout template. In some embodiments, a cell within the template is manually selected, for example by touching the cell within the template displayed on the mobile device screen, the component (or group of components, such as a PV module/inverter pair) installed at the complementary position within the solar array is scanned, and the obtained identification information populates the cell. In other embodiments, the component may be scanned first and then the corresponding cell within the template is manually selected and populated with the obtained identification information. In still other embodiments, the installation application automatically determines a cell to be populated. For example, the installation application may automatically populate a particular cell based on previously populated cells and motion data indicating a direction of motion of the mobile device (e.g., motion data obtained from an accelerometer of the mobile device). In yet other embodiments, the installation application may automatically generate and populate an array layout template subsequent to scanning the array components; for example, the installation application may create the populated template based on position information and/or motion data obtained while scanning the installed array components.

In addition to identification information, position information for the array components, such as an absolute position based on a fixed coordinate system, may be populated in the array layout template for identifying specific locations of the array components. For example, GPS coordinates may be obtained by a GPS module of the mobile device when the mobile device is proximate an installed component (e.g., while scanning the component), and such absolute position information may be added to the corresponding cell in the array layout template. In some alternative embodiments, identification information and absolute position information (e.g., GPS coordinates) for the solar array components are obtained and associated to one another such that a representation of the physical layout of the solar array may be determined and used to populated an array layout template at a later time.

Additionally, the populated array layout template provides a source of relative position information for the solar array components within the solar array.

In some embodiments, phase information may be used in populating the array layout template.

The method 400 returns from step 428 to step 426 until, at step 426, it is determined that there are no additional solar array components to be scanned for the solar array installation. The method 400 then proceeds to step 432, where a determination is made whether to associate the array layout template with site information pertaining to the solar array installation site. Such site information may include an address or GPS coordinates; a map; a rendered drawing, photograph or other imagery; or the like. In some embodiments, the mobile device may comprise an application for obtaining a map, photograph, or other imagery of the solar array site from a third-party website, such as a satellite imagery website.

If, at step 432, it is determined that no association needs to be made, the method 400 proceeds to step 438; if, at step 432, a determination is made to associate the array layout template with the site information, the method 400 proceeds to step 434, where the site information is obtained. In some embodiments, the site information may be manually entered into the mobile device by the installer; for example, the installer may enter an address of the site location. Additionally or alternatively, the site information may be automatically obtained by the installation application. For example, the installation application may utilize GPS coordinates of the solar array to retrieve the site information from a database of the mobile device; download the site information from the central website; or retrieve the site information from a third-party website (e.g., a satellite imagery website).

The method 400 proceeds to step 436. At step 436, the installation application associates the array layout template with the desired site information. In some embodiments, the installer may specify which site information to associate with the array layout template. For example, an address of the solar system location and/or a project number may be associated with the solar array layout template; the solar array layout template may be overlaid onto an aerial photograph of the solar array site; or other similar associations may be created. The method 400 proceeds to step 438.

At step 438, a determination is made whether to obtain any additional information pertaining to the solar array installation. If the result of such determination is no, the method 400 proceeds to step 442; if the result of the determination is yes, the method 400 proceeds to step 440, where the additional information is obtained. For example, in some embodiments the mobile device may comprise one or more sensors for determining azimuth and/or tilt information, and the installation application may determine the azimuth and/or tilt for the solar array when the mobile device is held proximately aligned with the solar array. The method 400 then proceeds to step 442.

At step 442, a determination is made whether to upload data (i.e., some or all of the solar system information) to the central website. If the result of such determination is no, the method 400 proceeds to step 446; if the result of such determination is yes, the method 400 proceeds to step 444. At step 444, the desired data is uploaded from the mobile device to the central website. The data may be uploaded wirelessly from the mobile device; by coupling the mobile device to a computer that is coupled (wirelessly or wired) to a communications network; or by coupling the mobile device to a master controller that comprises the central website. In some embodiments, the installer may select which data to upload. In other embodiments, all of the data collected during execution of the method 400 may be uploaded. In some alternative embodiments, data is uploaded to the central website in real-time as it is collected or periodically during the collection.

The method 400 proceeds to step 446. At step 446, a determination is made whether to save data (i.e., some or all of the solar system information), for example at a database of the mobile device and/or at the central website. If the result of such determination is no, the method 400 proceeds to step 450; if the result of such determination is yes, the method 400 proceeds to step 448. At step 448, the desired data is saved, for example, as specified by the installer. In some alternative embodiments, data is saved to the mobile device and/or central website in real-time as it is collected or periodically during the collection. The method 400 proceeds to step 450.

At step 450, a determination is made whether to continue. If the result of such determination is yes, the method 400 returns to step 414. If the result of such determination is no, the method 400 proceeds to step 460 where it ends.

In some alternative embodiments, the steps of the method 400 may be performed in a different order. For example, site information for the solar array site may be obtained upon login to the central website; login to the central website may be performed subsequent to scanning all of the solar array components; or a predefined array layout template may have previously been associated with (e.g., overlaid on) an aerial photograph of the site.

Figure 5A:
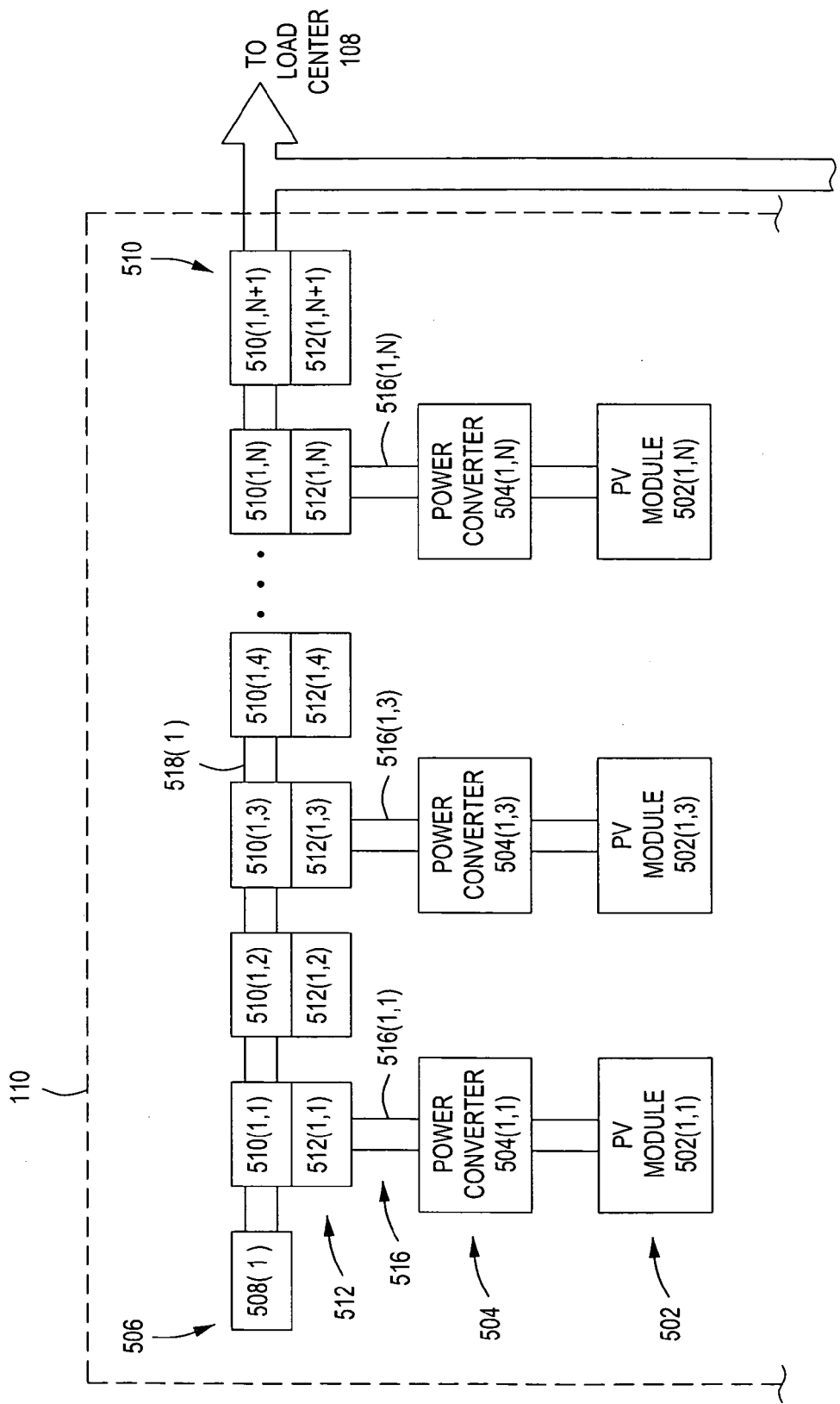
FIG. 5 is a block diagram of an alternative embodiment of a solar array in accordance with one or more embodiments of the present invention.
Figure 5B:
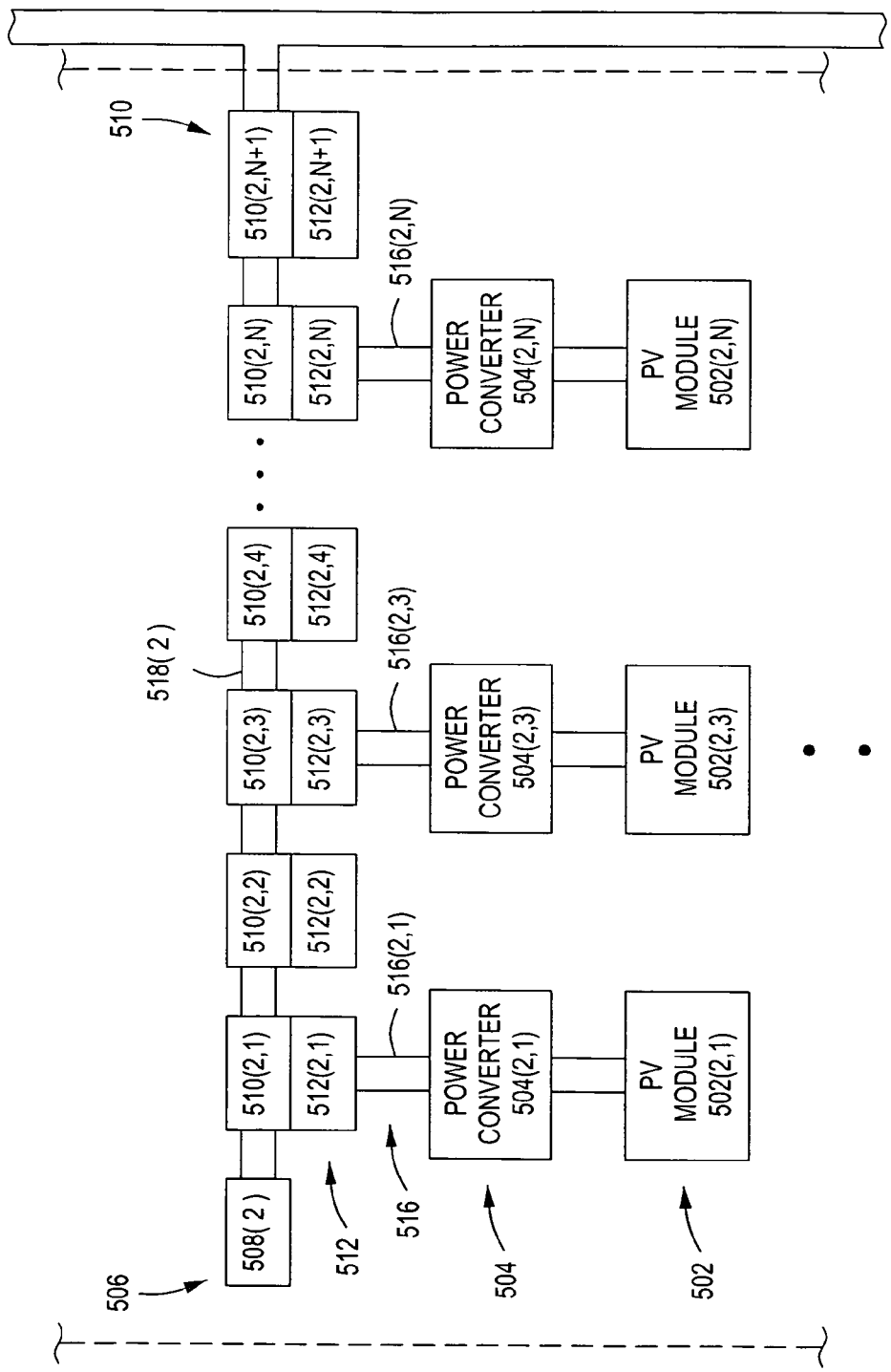
Figure 5C:
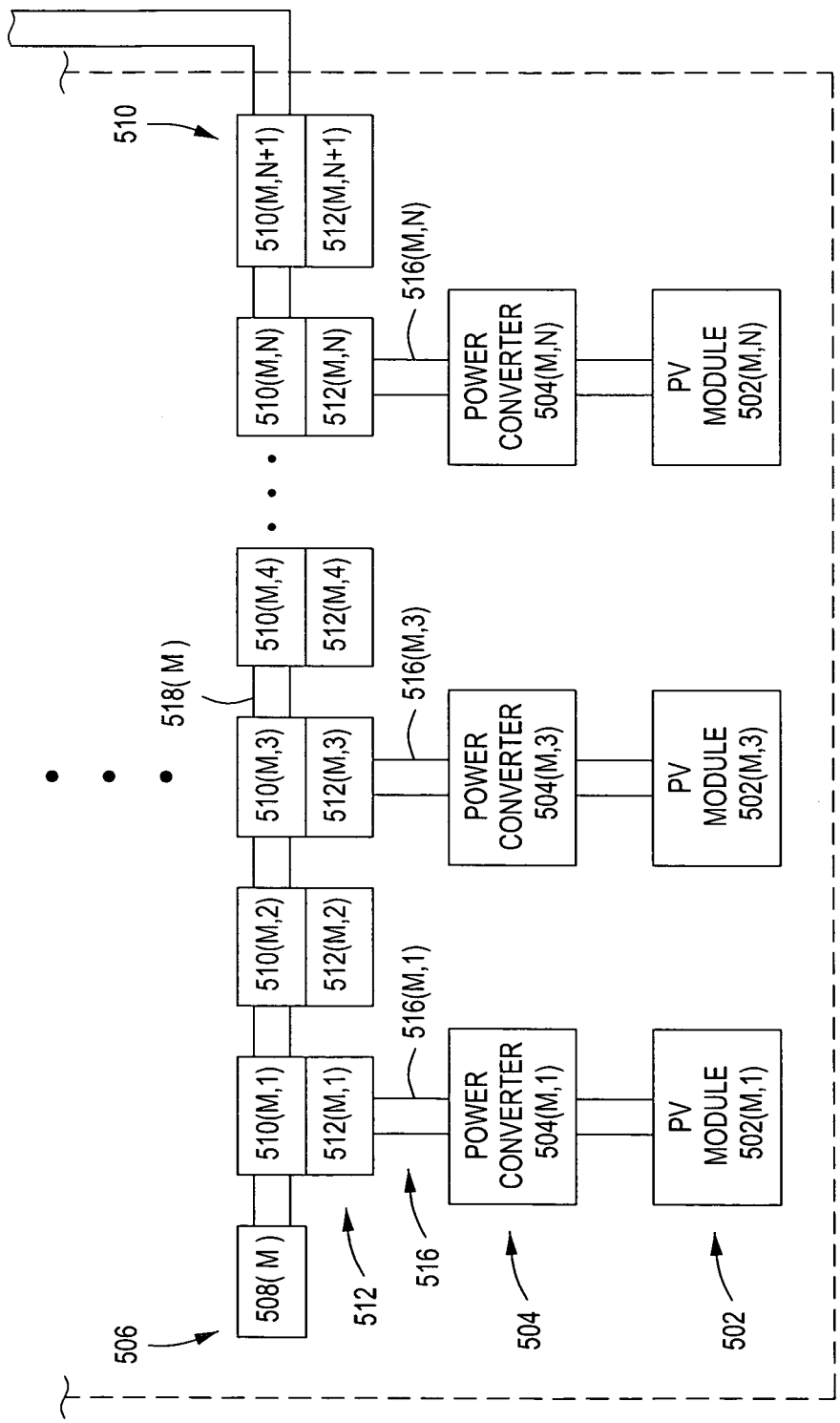

FIG. 5 is a block diagram of an alternative embodiment of the solar array 110 in accordance with one or more embodiments of the present invention. The solar array 110 comprises a plurality of photovoltaic (PV) modules 502(1,1), 502(1,2) . . . 502(M,N) (collectively referred to as PV modules 502), a plurality of power converters 504(1,1), 504(1,2) . . . 504(M,N) (collectively referred to as power converters 504), and a wiring system 506 for coupling the solar array 110 to the load center 108. Each power converter 504 is coupled in a one-to-one correspondence to a PV module 502; alternatively, multiple PV modules 502 may be coupled to a single power converter 504. In some embodiments, the power converters 504 are DC/AC inverters (i.e., inverters 104). Alternatively, the power converters 504 may be DC/DC converters and the generated DC power is coupled to a centralized DC/AC inverter (e.g., an inverter located at the load center 108); DC-driven systems; and/or a DC power storage system, such as batteries, for later use.

The wiring system 506 comprises a plurality of cables 518(1), 518(2) . . . 518(M), (collectively referred to as trunk cables 518), a plurality of splice boxes 510(1,1), 510(1,2) . . . 510(M,N+1), (collectively referred to as splice boxes 510) and a plurality of termination blocks 508(1), 508(2) . . . 508(M), (collectively referred to as termination blocks 508) for terminating the distal end of the cable 518. Each of the power converters 504 are coupled to a splice box 510 via a plurality of drop connectors 512(1,1), 512(1,2) . . . 512(M, N+1), (collectively referred to as drop connectors 512) and a plurality of drop cables 516(1,1), 516(1,2) . . . 516(M,N), (collectively referred to as drop cables 516). In some embodiments, such as the embodiment depicted in FIG. 5, there are more splice boxes 510/drop connectors 512 than power converters 504, and one or more of the splice boxes 510/drop connectors 512 are not connected to a power converter 504.

An example of such a system may be found in co-pending, commonly owned U.S. patent application Ser. No. 12/931, 081, filed Jan. 24, 2011, which is herein incorporated by reference.

For one or more of the PV modules 502, power converters 504, splice boxes 510, drop connectors 512, drop cables 516, and the termination block 508, the installation application 128 may obtain identification and/or position information as previously described (e.g., identification information may be obtained from an identification tag coupled to a component; position information may be determined based on GPS coordinates of a component; and the like). The installation application 128 may also generate an array layout template comprising at least part of such information, also as previously described. Additionally, in a polyphase system, the installation application 128 may obtain phase information identifying those phases to which each of the splice boxes 510 is coupled. For example, the phase information may be obtained via identification tags coupled to the splice boxes 510. Such phase information may be used in populating the array layout template.

The installation application 128 may further obtain other solar system information pertaining to the solar array 110 (e.g., site information, such as a map or other imagery of the solar array location) as well as generate associations between various subsets of the solar system information (e.g., the identification and phase information corresponding to each coupled splice box 510/drop connector 512/power converter 504/PV module 502 may be associated), as previously described.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. An apparatus for managing installation information comprising:
   a mobile device comprising an installation application for (i) obtaining identification information for at least one component in an installation, (ii) obtaining position information regarding the at least one component, and (iii) generating a template that indicates a physical layout of at least part of the installation based on the identification and the position information.

2. The apparatus of claim 1 further comprising an ID transducer for obtaining the identification information from an identification tag coupled to the at least one component in the installation, wherein the installation is a solar array installation.

3. The apparatus of claim 2 wherein the identification tag is at least one of a radio frequency identification (RFID) tag or a bar code label.

4. The apparatus of claim 1 wherein the mobile device further comprises a Global Navigation Satellite Systems (GNSS) receiver to receive GNSS signals from a GNSS satellite for determining the position information.

5. The apparatus of claim 1 wherein the position information is obtained by wireless signal triangulation techniques utilizing a wireless transceiver of the mobile device.

6. The apparatus of claim 1 wherein the position information identifies at least one of absolute position or relative position within the installation of the at least one component.

7. The apparatus of claim 1 wherein the position information is automatically obtained by placing the mobile device proximate the at least one component.

8. The apparatus of claim 1 wherein the installation application further obtains site information pertaining to a location of the installation and associates the template and the site information.

9. The apparatus of claim 8 wherein the site information comprises at least one of an address, Global Positioning System (GPS) coordinates, a map, a photograph of the location, satellite imagery of the location, or a rendered drawing of the location.

10. The apparatus of claim 8 wherein the template and the site information are associated to produce an overlay of the physical layout on visual imagery of the location.

11. A method of managing installation information comprising:
- obtaining, via an installation application on a mobile device comprising at least one processor, identification information for at least one component of an installation;
- obtaining, via the installation application, position information for the at least one component; and
- generating, via the installation application, a template for indicating a physical layout of at least a portion of the installation based on the identification and the position information.

12. The method of claim 11 wherein obtaining the identification information comprises scanning the at least one component in the installation, wherein the installation is a solar array installation.

13. The method of claim 12 wherein scanning the at least one component comprises at least one of optically reading a barcode label or receiving a wireless communication from a radio frequency identification (RFID) tag.

14. The method of claim 11 wherein obtaining the position information comprises obtaining Global Positioning System (GPS) coordinates for the at least one component.

15. The method of claim 11 further comprising obtaining site information pertaining to a location of the installation.

16. The method of claim 15 further comprising associating the site information and the template to produce an overlay of the physical layout on visual imagery of the site.

17. The method of claim 11 wherein the identification and the position information are at least one of manually entered or wirelessly transmitted to the mobile device while the mobile device is held proximate the at least one component.

18. The method of claim 11 wherein the template is automatically populated with the identification information, wherein the identification information comprises at least one of serial numbers, part numbers, or assigned identifiers.

19. A computer readable medium for storing a program that, when executed by a processor, causes the processor to perform a method for managing installation information, the method comprising:
- obtaining identification information for at least one component of an installation;
- obtaining position information for the at least one component; and
- generating a template for indicating a physical layout of at least a portion of the installation based on the identification and the position information.

20. The computer readable medium of claim 19 wherein the method further comprises obtaining site information pertaining to a location of the installation, and associating the template with the site information to produce an overlay of the physical layout on visual imagery of the site.

* * * * *